United States Patent
Ishibashi

(10) Patent No.: US 11,447,888 B2
(45) Date of Patent: Sep. 20, 2022

(54) CRYSTAL FIBER MANUFACTURING METHOD

(71) Applicant: Nippon Telegraph and Telephone Corporation, Tokyo (JP)

(72) Inventor: Shigeo Ishibashi, Musashino (JP)

(73) Assignee: NIPPON TELEGRAPH AND TELEPHONE CORPORATION, Tokyo (JP)

( * ) Notice: Subject to any disclaimer, the term of this patent is extended or adjusted under 35 U.S.C. 154(b) by 171 days.

(21) Appl. No.: 17/057,479

(22) PCT Filed: Mar. 15, 2019

(86) PCT No.: PCT/JP2019/019380
§ 371 (c)(1),
(2) Date: Nov. 20, 2020

(87) PCT Pub. No.: WO2019/225446
PCT Pub. Date: Nov. 28, 2019

(65) Prior Publication Data
US 2021/0198802 A1    Jul. 1, 2021

(30) Foreign Application Priority Data
May 22, 2018  (JP) .............................. JP2018-098325

(51) Int. Cl.
*C30B 13/30*      (2006.01)
*C30B 13/22*      (2006.01)
(Continued)

(52) U.S. Cl.
CPC .............. *C30B 13/30* (2013.01); *C30B 13/22* (2013.01); *C30B 29/28* (2013.01); *C30B 29/60* (2013.01);
(Continued)

(58) Field of Classification Search
CPC .......... C30B 13/30; C30B 13/22; C30B 29/60; H01S 3/06716; H01S 3/1623;
(Continued)

(56) References Cited

U.S. PATENT DOCUMENTS 5,037,181 A * 8/1991 Byer .................... H01S 3/06708
                                                                    385/144
5,077,087 A * 12/1991 Byer ........................ H01S 3/092
                                                                    65/390

FOREIGN PATENT DOCUMENTS

EP          0864671        *  9/1998

OTHER PUBLICATIONS

International Search Report dated Aug. 6, 2019, issued in PCT Application No. PCT/JP2019/019380, filed May 15, 2019.
(Continued)

*Primary Examiner* — Robert M Kunemund
(74) *Attorney, Agent, or Firm* — Workman Nydegger

(57) ABSTRACT

Provided is a method for producing a crystal fiber which can suppress the occurrence of stress birefringence even while distributing a light emission center so as to concentrate on a cross-sectional middle portion. The method for producing a crystal fiber comprises the steps of: using, as a preform, the crystal fiber comprising a light emission center that volatilizes from a melted portion upon the melting of a crystal, and heating a portion or a plurality of portions of the side of the preform, whereby the portion or the plurality of portions of the preform are melted such that only a given amount of the inside of the portion or the plurality of portions of the preform is not melted, to form the melted portion; and sequentially transferring the melted portion in the longitudinal direction of the preform, and cooling the melted portion, whereby the melted portion is continuously recrystallized to form a recrystallized region.

14 Claims, 6 Drawing Sheets

(51) Int. Cl.
  *C30B 29/28*  (2006.01)
  *C30B 29/60*  (2006.01)
  *H01S 3/067*  (2006.01)
  *H01S 3/16*   (2006.01)

(52) U.S. Cl.
  CPC ........ *H01S 3/06716* (2013.01); *H01S 3/1623* (2013.01); *H01S 3/1625* (2013.01); *H01S 3/1636* (2013.01); *H01S 3/1643* (2013.01); *H01S 3/1658* (2013.01)

(58) Field of Classification Search
  CPC .... H01S 3/1625; H01S 3/1636; H01S 3/1643; H01S 3/1658
  See application file for complete search history.

(56) References Cited

OTHER PUBLICATIONS

Walter Koechner et al., *Solid-State Lasers: A Graduate Text*, Springer Science & Business Media, 2003, pp. 230-231.

Mark Dubinskii et al., *Low-Loss 'Crystalline-Core/Crystalline-Clad' (C4) Fibers for Highly Power Scalable High Efficiency Fiber Lasers*, Opt. Express 26, vol. 26, No. 4, 2018, pp. 5092-5101.

K. Kitamura et al., *Stress-Birefringence Associated with Facets of Rare-Earth Garnets Grown from the Melt; A Model and Measurement of Stress-Birefringence Observed in Thin Sections*, Journal of Crystal Growth, vol. 62, No. 2, 1983, pp. 351-359.

S. Ishibashi et al., *Cr, Ca : Y3Al5O12 Laser Crystal Grown by the Laser-Heated Pedestal Growth Method*, Journal of Crystal Growth, vol. 183, No. 4, 1998, pp. 614-621.

Shigeo Ishibashi et al., *Mode-Locked Operation of $Cr^{4+}$:YAG Single-Crystal Fiber Laser with External Cavity*, Opt. Express 22, vol. 22, No. 6, 2014, pp. 6764-6771.

Teiichi Ueno et al., *Syntheses of YAG by Flux-Method and Crystallography*, Fukuoka University of Education Journal, 3rd volume, Department of Mathematics, Science and Technology, vol. 63, 2014, pp. 109-126.

Toshiyuki Sata, *High Temperature Vaporization of Inorganic Materials*, Journal of the Mineralogical Society of Japan, vol. 16, Special No. 1, 1983, pp. 137-146.

Onyx Optics, Inc., In-Stock Catalog, Web Literature, http://www.onyxoptics.com/catalog/OnyxOptics_catalog.pdf, May 16, 2018 (Reading Day), pp. 1-63.

* cited by examiner

US 11,447,888 B2

CRYSTAL FIBER MANUFACTURING METHOD

TECHNICAL FIELD

The present invention relates to a method for producing a crystal fiber for use mainly in optically pumped solid-state laser oscillators and light amplifiers, the method involving distributing a light emission center so as to concentrate on or near the middle in a cross section.

BACKGROUND ART

Femtosecond pulse light sources or broadband wavelength-tunable light sources are widely used in the industrial, medical and academic fields, etc. Optically pumped solid-state laser oscillators and amplifiers are major devices constituting these light sources. These devices have a laser crystal as an amplification medium. For example, $Y_3Al_5O_{12}$ supplemented with a tetravalent Cr atom (hereinafter, referred to as $Cr^{4+}$:YAG), Ti (titanium):sapphire, or Cr (chromium):forsterite is used as the laser crystal.

The devices oscillate or amplify, through the laser crystal, light beam that has a beam profile of Gauss function type (hereinafter, referred to as a gaussian beam profile) having a $M^2$ value close to 1, and is linearly polarized light. In this context, the $M^2$ value is a numeric value indicating the degree to which an actual beam profile deviates from the beam profile of Gauss function type. The $M^2$ value of 1 represents having an ideal beam profile of Gauss function type. There is a technical problem to enhance the ratio of oscillatory light (or amplified light) output power to excitation light input power, i.e., excitation efficiency, in the oscillation or amplification of light beam.

For improvement in excitation efficiency, attempts have been made to produce a laser crystal having a waveguide structure as to excitation light or as to both excitation light and oscillatory light (or amplified light). A production method of processing a bulk crystal so as to have an internal refractive index distribution or a surface ridge structure, and a method of producing a crystal having a fiber shape are known as methods for producing the waveguide structure. In the case of using multi-mode semiconductor laser, which saves cost and has a high output, but has a $M^2$ value much larger than 1, as an excitation light source, a waveguide based on a crystal having a fiber shape is considered to have the highest excitation efficiency among such waveguide structures.

Here, the terms used in the specification of the present application will be defined. A crystal having a fiber shape is referred to as a crystal fiber. A crystal fiber composed of a single crystal having a single major portion is referred to as a single-crystal fiber. The single-crystal fiber used as a waveguide is referred to as a single-crystal fiber waveguide. In this context, assuming a rectangle with the minimum area circumscribing a cross section of the crystal fiber, the length of the long side thereof is defined as the diameter of the crystal fiber.

In the case of using multi-mode semiconductor laser as an excitation light source, the crystal fiber needs to have a diameter on the order of 100 µm or larger for highly efficient coupling of excitation light. In this respect, it is known that oscillation efficiency is improved, provided that: a crystal fiber is configured such that the distribution of a light emission center added to a preform in order to absorb excitation light is concentrated on or near the middle in a cross section of the crystal fiber (cross-sectional light emission center distribution type); and propagation loss is sufficiently low for oscillatory light or amplified light that is a linearly polarized light and has a gaussian beam profile (Non-Patent Literature 1).

A cross-sectional light emission center distribution-type single-crystal fiber waveguide using $Y_3Al_5O_{12}$ supplemented with a trivalent Yb (ytterbium) atom (hereinafter, referred to as $Yb^{3+}$:YAG) with the aim of improving the excitation efficiency described above is known. This single-crystal fiber waveguide is produced by first producing a $Yb^{3+}$:YAG single-crystal fiber, and allowing a YAG single crystal free from the light emission center Yb atom to grow on the lateral surface thereof by liquid phase epitaxy (hereinafter, referred to as the LPE method). As a result, $Yb^{3+}$:YAG is located in the middle portion, and the Yb atom-free YAG single crystal is located in a neighboring portion. Thus, an absorption region for excitation light resides only in the middle portion (Non-Patent Literature 2).

FIG. 1 shows the configuration of a cross-sectional light emission center distribution-type single-crystal fiber waveguide using $Yb^{3+}$:YAG, and a production method thereof. FIG. 1(a) is a schematic view of a cross section of the waveguide. FIG. 1(b) is a flow diagram showing the outline of the production method. FIG. 1(c) is a schematic view of this single-crystal fiber waveguide used to constitute a laser oscillator or amplifier.

In FIG. 1(a), the diameter of middle portion 102 of single-crystal fiber waveguide 101 is 100 µm, and the diameter of the single-crystal fiber waveguide 101 is 220 µm (the diameter of the middle portion 102+the thickness of neighboring portion 103 of the single-crystal fiber waveguide 101). The cross sections of the single-crystal fiber waveguide 101 and the middle portion 102 have a shape close to a regular hexagon because the orientation of production is regarded as [111].

FIG. 1(b) is a flow diagram showing the outline of a method for producing this single-crystal fiber waveguide 101. This production method comprises two steps. First, an $Yb^{3+}$:YAG single-crystal fiber is produced by a laser heated pedestal growth method (hereinafter, referred to as the LHPG method) and used as the middle portion 102 of the single-crystal fiber waveguide 101 (S101). Subsequently, a YAG single crystal free from the light emission center is allowed to grow on the entire circumference of the middle portion 102 by the LPE method, and used as the neighboring portion 103 of the single-crystal fiber waveguide 101 (S102).

FIG. 1(c) is a schematic view of this single-crystal fiber waveguide 101 used to constitute a laser oscillator or amplifier. Excitation light 108 incident from a first end portion of the single-crystal fiber waveguide 101 is propagated in the inside of the single-crystal fiber waveguide 101 and absorbed to the middle portion 102. Oscillatory light or amplified light 109 is radiated from the first or second end portion of the single-crystal fiber waveguide 101.

CITATION LIST

Non-Patent Literature

Non-Patent Literature 1: Walter Koechner and Michael Bass, "Solid-State Lasers: A Graduate Text", Springer Science & Business Media (2003), p. 231

Non-Patent Literature 2: Mark Dubinskii, Jun Zhang, Viktor Fromzel, Youming Chen, Stuart Yin, and Claire Luo, "Low-loss 'crystalline-core/crystalline-clad' (C4) fibers for highly power scalable high efficiency fiber lasers", Opt. Express 26, 5092-5101 (2018)

Non-Patent Literature 3: K. Kitamura, S. Kimura, Y. Miyazawa, and Y. Mori, "Stress-birefringence associated with facets of rare-earth garnets grown from the melt; A model and measurement of stress-birefringence observed in thin sections", Journal of Crystal Growth, Volume 62, Issue 2, 1983, Pages 351-359

Non-Patent Literature 4: S. Ishibashi, K. Naganuma, I. Yokohama, "Cr, Ca:Y3Al5O12 laser crystal grown by the laser-heated pedestal growth method", Journal of Crystal Growth, Volume 183, Issue 4, 1998, Pages 614-621

Non-Patent Literature 5: Shigeo Ishibashi and Kazunori Naganuma, "Mode-locked operation of Cr4+:YAG single-crystal fiber laser with external cavity", Opt. Express 22, 6764-6771 (2014)

Non-Patent Literature 6: Teiichi Ueno, Takafumi Fukumori, Akiko Kariya, Marina Imai, Haruka Masuoka, Ikumi Fukunaga, Kyoko Kaneko, and Isoroku Nagasawa, "Syntheses of YAG by flux-method and crystallography", Bulletin of Fukuoka University of Education, No. 63, 109-126 (2014)

Non-Patent Literature 7: Toshiyuki Sata, "High temperature vaporization of inorganic materials", Journal of the Mineralogical Society of Japan, Vol. 16, No. 1 (special), 137-146 (1983)

Non-Patent Literature 8: Catalog of Onyx Optics, Inc. (Homepage of Onyx Optics, Inc. http://www.onyxoptics.com/catalog/OnyxOptics_catalog.pdf, downloaded on May 16, 2018)

SUMMARY OF THE INVENTION

Technical Problem

Middle portion 102 of $Yb^{3+}$:YAG single-crystal fiber waveguide 101 is produced by lifting from a melt obtained by heating a raw material by use of the LHPG method. During the production of the middle portion 102 by the LHPG method, a solid-liquid interface is curved so that accretionary growth proceeds in which the direction of progression of growth is not limited to a specific crystal orientation. By contrast, LPE growth conditions for a YAG single crystal free from the light emission center in neighboring portion 103 are selected so as to attain lateral growth in which the crystal grows along a specific plane orientation. According to the previous report, YAG single crystals produced by these two modes of growth are known to differ by approximately $10^{-4}$ nm in lattice constant, and these single crystals in contact with each other cause stress birefringence on the order of $10^{-5}$ in the single-crystal fiber waveguide (Non-Patent Literature 3). This means phase difference on the order of $\pi/2$ in a waveguide having a length of 40 mm.

Thus, the crystal fiber waveguide of cross-sectional light emission center distribution type produced by the conventional method cannot guide, with low propagation loss, oscillatory light or amplified light that is linearly polarized light and has a gaussian beam profile. Hence, there has been a demand for a method for producing a crystal fiber waveguide which can suppress the occurrence of stress birefringence even while distributing a light emission center so as to concentrate on a cross-sectional middle portion.

Means for Solving the Problem

The present invention has been made in light of the problems described above, and an object of the present invention is to provide a method for producing a crystal fiber which achieves a highly efficient laser oscillator or amplifier. Specifically, an object of the present invention is to produce a crystal fiber that enables improvement in excitation efficiency by concentrating a light emission center on a region at or near the middle in a cross section of the crystal fiber, whereby the volume ratio of an excited region in the crystal fiber is decreased.

The production method according to one embodiment of the present invention comprises the steps of: using, as a preform, the crystal fiber comprising a light emission center that volatilizes from a melted portion upon the melting of a crystal, and heating a portion of the side of the preform or a plurality of portions of the side of the preform positionally equal in the longitudinal direction of the preform, whereby the portion or the plurality of portions of the preform are melted such that only a given amount of the inside of the portion or the plurality of portions of the preform is not melted, to form the melted portion; and sequentially transferring the melted portion in the longitudinal direction of the preform, and cooling the melted portion, whereby the melted portion is continuously recrystallized to form a recrystallized region.

According to another embodiment, the method for producing a crystal fiber of cross-sectional light emission center distribution type which concentrates a light emission center on or near the middle in a cross section of the crystal fiber comprises the steps of: using, as a preform, the crystal fiber comprising a light emission center that volatilizes from a melted portion upon the melting of a crystal, and heating a portion of the side of the preform or a plurality of portions of the side of the preform positionally equal in the longitudinal direction of the preform, whereby the portion or the plurality of portions of the preform are melted such that only a given amount of the inside of the portion or the plurality of portions of the preform is not melted, to form the melted portion; sequentially transferring the melted portion in the longitudinal direction of the preform, and cooling the melted portion, whereby the melted portion is continuously recrystallized to form a first recrystallized region; a) heating a site that is the portion of the side of the preform or the plurality of portions of the side of the preform positionally equal in the longitudinal direction of the preform, and is a portion other than the first to n−1th (wherein n represents a positive integer with 2 as an initial value) recrystallized regions thus formed, whereby the portion or the plurality of portions of the preform are melted such that only a given amount of the inside of the portion or the plurality of portions of the preform is not melted, to form the melted portion; b) sequentially transferring the melted portion in the longitudinal direction of the preform, and cooling the melted portion, whereby the melted portion is continuously recrystallized to form a nth recrystallized region; and c) when the maximum value of the n is defined as M (wherein M represents a positive integer of 2 or larger), repeating the steps a) and b) predetermined times by increasing the n one by one until the n becomes predetermined M.

According to one embodiment, in the method for producing a crystal fiber, the step of forming the first to Mth recrystallized regions is a step that is performed while cooling the portion or the plurality of portions of the preform opposed to the melted portion via an axis along the longitudinal direction of the preform.

According to one embodiment, in the method for producing a crystal fiber, the step of forming the first to Mth recrystallized regions comprises contacting the portion or the plurality of portions of the preform with a cooling block when the portion or the plurality of portions of the preform are cooled.

Effects of the Invention

According to the present invention, a light emission center can be concentrated on or near the middle in a cross section of a crystal fiber. Thus, the volume ratio of an excited region in the crystal fiber can be decreased even when a light source having a $M^2$ value much larger than 1, such as multi-mode semiconductor laser, is used as an excitation light in excitation. As a result, the excitation efficiency of a laser oscillator or amplifier can be improved more than ever.

BRIEF DESCRIPTION OF DRAWINGS

FIG. 1(a) is a cross-sectional view of an $Yb^{3+}$:YAG single-crystal fiber waveguide having a cross-sectional light emission center distribution. FIG. 1(b) is a flow diagram showing a production method thereof. FIG. 1(c) is a schematic view of the single-crystal fiber waveguide used in a laser oscillator or amplifier.

FIG. 2 is a schematic view of the shape of a $Cr^{4+}$:YAG single-crystal fiber used as a preform in Example 1 of the present invention.

FIG. 5 is a schematic view of a single-crystal fiber waveguide of cross-sectional light emission center distribution type produced in Example 1 of the present invention.

FIG. 6 is a schematic view showing a method for producing a single-crystal fiber waveguide in Example 2 of the present invention.

DESCRIPTION OF EMBODIMENTS

Hereinafter, the embodiments of the present invention will be described in detail. The embodiments of the present invention are not limited to the embodiments illustrated below, without departing from the scope of the present invention.

The invention of the present application relates to a method for producing a crystal of fiber type, i.e., a crystal fiber. The present invention is also directed to the case where a major portion is constituted by a plurality of single crystals or the case where a single crystal is combined with another material. For a waveguide structure, a material different from that for the major portion may be attached to the side of the fiber. Alternatively, a structure controlling a reflectance for excitation light or oscillatory light may be placed on an end face.

EXAMPLE 1

A method for producing a single-crystal fiber waveguide of cross-sectional light emission center distribution type using $Cr^{4+}$:YAG as a preform will be described below as the first Example of the present invention.

Figure 4:
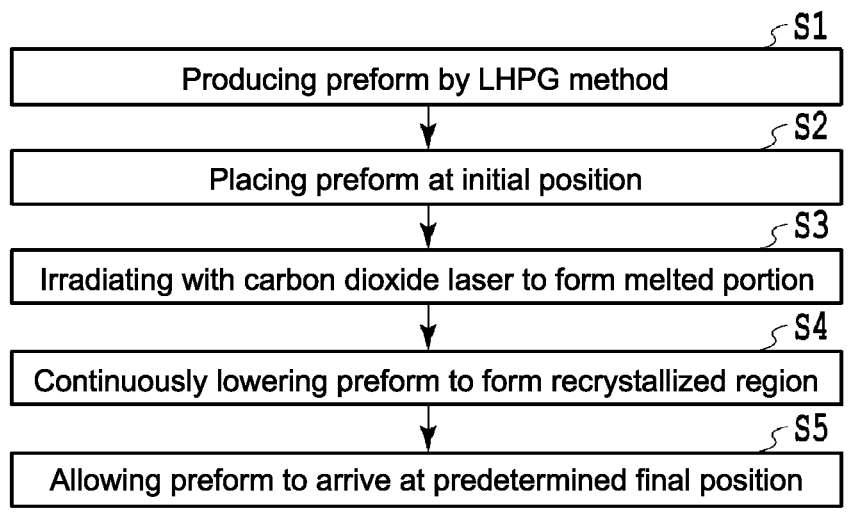
FIG. 4 is a flow diagram showing a method for producing the single-crystal fiber waveguide in Example 1 of the present invention.

FIG. 4 is a flow diagram showing a method for producing single-crystal fiber waveguide 5 in this Example. Each step (S1 to S5) will be described with reference to this flow diagram.

$Cr^{4+}$:YAG is a laser crystal that is excited by light at a wavelength around 1 μm and oscillated by a broadband wavelength including a wavelength of 1.4 μm. The light emission center is $Cr^{4+}$. This laser crystal can be used in femtosecond pulse light sources or broadband wavelength-tunable light sources (Non-Patent Literature 5).

First, a $Cr^{4+}$:YAG single-crystal fiber serving as a crystal fiber preform is produced by the LHPG method (S1). The production method and the production conditions are the same as those described in Non-Patent Literature 4.

Figure 1:
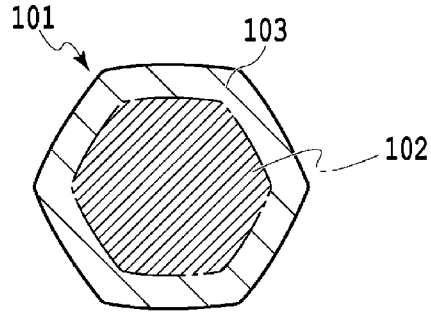
FIG. 1 shows a conventional example of a method for producing a cross-sectional light emission center distribution-type crystal fiber.
Figure 1:
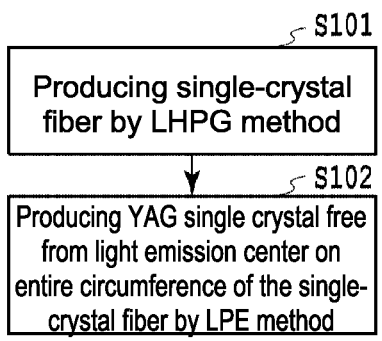
Figure 1:
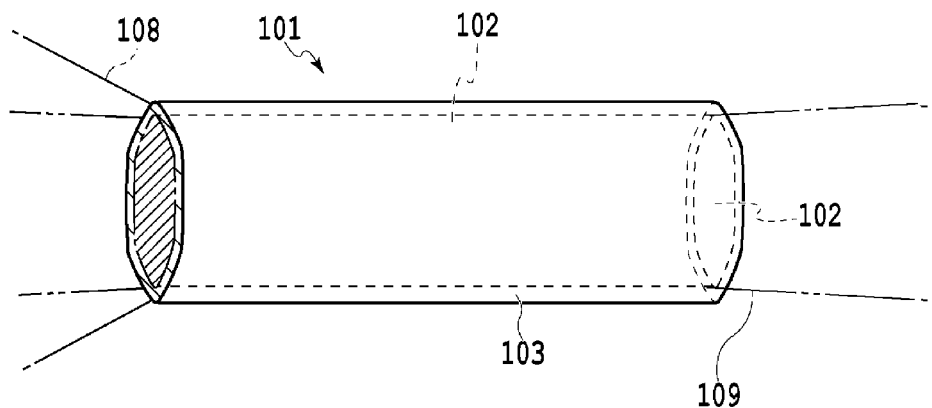
Figure 2A:
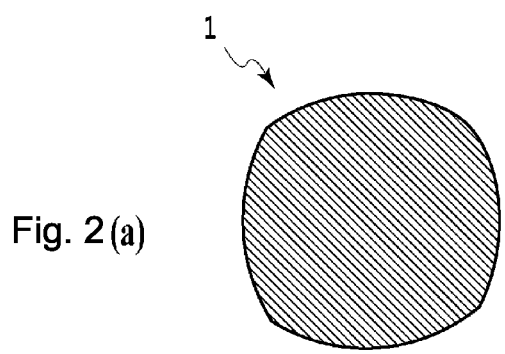
FIG. 2(a) is a cross-sectional view.
Figure 2B:
FIG. 2(b) is a perspective view.

FIG. 2 is a schematic view of the shape of preform 1 thus produced. FIG. 2(a) is a cross-sectional view thereof, and FIG. 2(b) is a perspective view thereof.

The preform 1 is supplemented with small amounts of a Cr atom and a Ca (calcium) atom. The Ca atom exists in a positive divalent state in the crystal and works as a charge compensation medium. Hence, in the absence of a charge compensator, the Cr atom, which is most stable in a positive trivalent state, can be in a higher valent state to form the light emission center $Cr^{4+}$. The distribution of the light emission center in the cross section of the preform 1 is disproportionate only slightly and is substantially constant.

The orientation of production of the preform 1 is set to 15° in the orientation from [100] to [110] so as to attain accretionary growth throughout the solid-liquid interface. The cross section of the YAG single-crystal fiber lifted in this orientation has, as shown in FIG. 2(a), a shape in which each side of a square is curved outward (Non-Patent Literature 4).

Next, the step of processing the preform 1 into a single-crystal fiber of cross-sectional light emission center distribution type (S2 to S4) is performed. In this step, recrystallized region 6 having a low concentration of the light emission center is formed in the preform 1. The atmosphere in this Example is an oxygen atmosphere.

Figure 3:
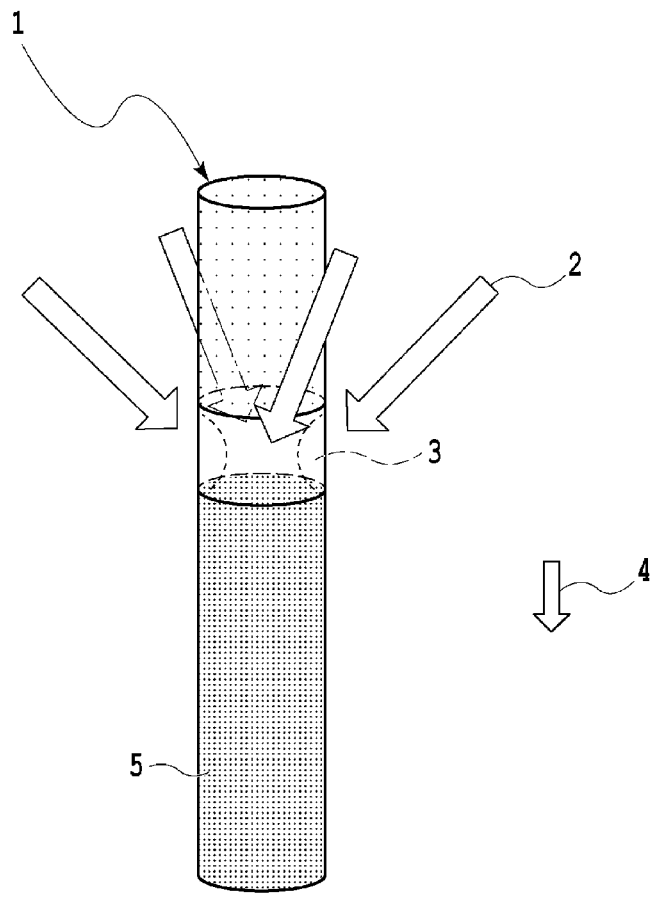
FIG. 3 is a schematic view showing a method for forming a recrystallized region and a non-melted region of a single-crystal fiber waveguide in Example 1 of the present invention.

FIG. 3 is a schematic view showing a method for forming the recrystallized region in Example 1 of the present invention.

The lower end in the longitudinal direction of the preform 1 is oriented in vertical direction 4. The preform 1 is placed such that a side near the lower end of the preform 1 where processing is started is located at the position of irradiation with carbon dioxide laser light 2 serving as a heat source (S2). Next, the preform 1 is heated by irradiation with the carbon dioxide laser light 2 from four directions. All the directions of irradiation are between the horizontal direction and downward 90°. A plane perpendicular to the central axis of the preform 1 is taken, and X and Y orthogonal axes on the plane are assumed. Four vectors in the respective directions of irradiation projected into this plane have directions of 0° to 90°, 90° to 180°, 180° to 270°, and 270° to 360°, respectively, when the X axis+ direction is defined as 0°. In this respect, a portion of the heated preform 1 is melted by elevating the temperature so as to exceed the melting point. This melted portion is referred to as melted portion 3.

The output of the carbon dioxide laser light 2 is adjusted such that a given amount of the inside of the melted portion 3 remains without being melted (S3).

After the formation of the melted portion 3, the preform 1 is continuously lowered along the vertical direction 4 to recrystallize the melted portion 3. This recrystallized region is referred to as recrystallized region 6. The portion remaining without being melted is referred to as non-melted region 7. The non-melted region 7 includes the central axis of the preform 1 (S4).

Some Cr atoms contained in the preform 1 volatilize from the melted portion 3. Thus, the recrystallized region 6 has a lower Cr atom concentration than that of the crystal fiber preform 1. On the other hand, the non-melted region 7, unlike the melted portion 3, undergoes neither heat melting nor volatilization of Cr atoms in association therewith and therefore has the same Cr atom concentration as that of the preform 1.

The lowering is continuously pursued up to a predetermined final position. The recrystallized region 6 and the non-melted region 7 are continuous along the longitudinal direction of the single-crystal fiber and constitute a uniform shape in the cross section (S5).

Figure 5A:
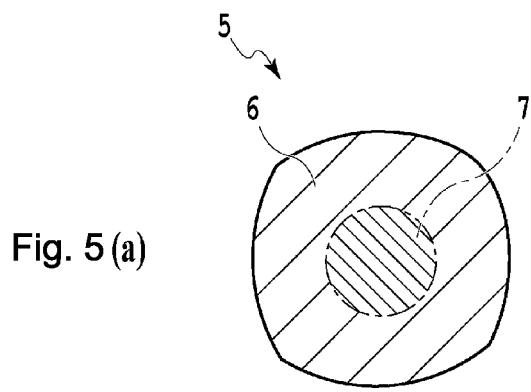
FIG. 5(a) is a cross-sectional view.
Figure 5B:
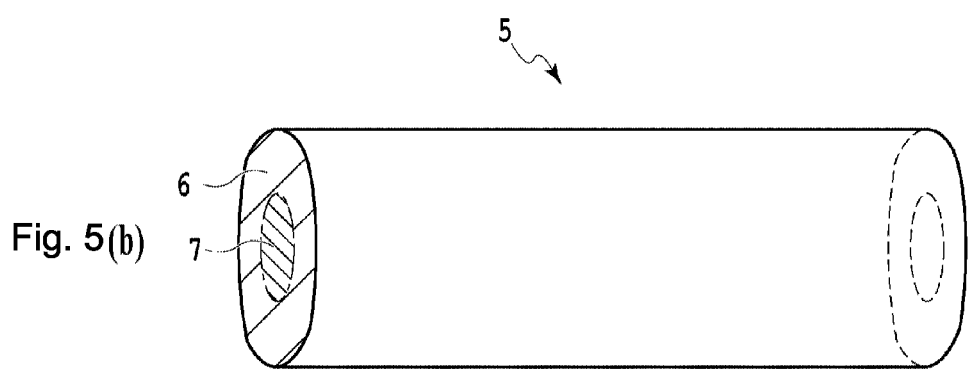
FIG. 5(b) is a perspective view.
Figure 5C:
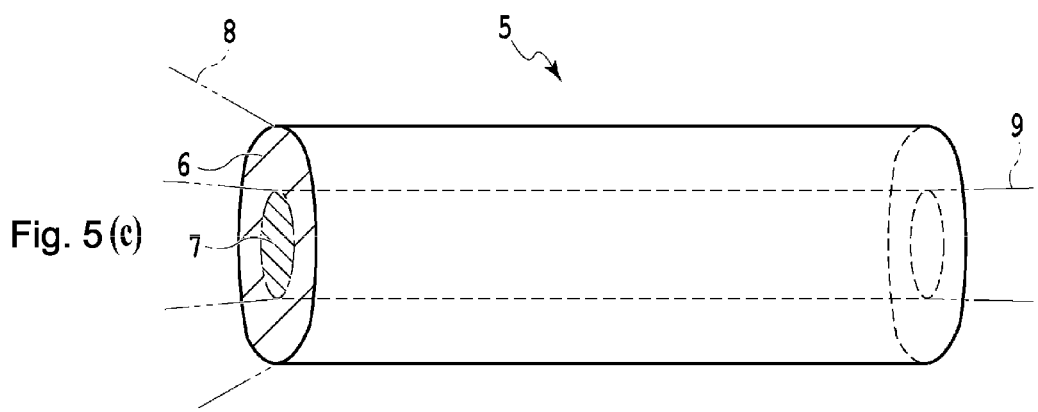
FIG. 5(c) is a schematic view of the single-crystal fiber waveguide used in a laser oscillator or amplifier.

FIG. 5 is a schematic view of the single-crystal fiber waveguide 5 produced in this Example. FIG. 5($a$) is a cross-sectional view thereof. FIG. 5($b$) is a perspective view thereof. FIG. 5($c$) is a schematic view of the single-crystal fiber used in a laser oscillator or amplifier.

The diameter of the non-melted region 7 is 100 μm, and the diameter of the single-crystal fiber waveguide 5 is 200 μm (the diameter of the non-melted region 7+the thickness of the recrystallized region 6).

After the completion of the step of forming the recrystallized region, thermal annealing treatment is appropriately performed, if necessary. The thermal annealing treatment is a treatment which involves elevating the temperature to a predetermined temperature equal to or lower than the melting point, maintaining this temperature for a predetermined given time, and gradually decreasing the temperature over a predetermined time, and is performed in an oxygen atmosphere for the purpose of increasing the light emission center concentration (Non-Patent Literature 5).

When the thermal annealing treatment is not performed, after the completion of the step of forming the recrystallized region, a $SiO_2$ (silicon dioxide) vapor-deposited film is formed so as to cover the outer circumference of the single-crystal fiber waveguide 5, and used as a clad for the single-crystal fiber waveguide 5. When the thermal annealing treatment is performed, the clad is formed after the completion of the thermal annealing treatment. The clad is not shown in FIG. 5. The clad formation is performed as described in Non-Patent Literature 5.

Hereinafter, a lattice constant will be discussed to estimate the influence of stress birefringence on oscillatory light. As for the lattice constant of the $Cr^{4+}$:YAG single crystal, the influence of difference in mode of growth and the influence of the concentration of an added Cr atom need to be discussed. The mode of growth upon recrystallization for the recrystallized region 6 is accretionary growth (S4) and does not differ from the mode of growth at the time of production of the preform 1 (S1). This causes no difference in lattice constant from the non-melted region 7.

By contrast, the concentration of an added Cr atom differs between the recrystallized region 6 and the non-melted region 7. In a preliminary experiment, the whole $Cr^{4+}$:YAG single-crystal fiber was recrystallized. In this case, some Cr atoms volatilized from the melted portion, and the Cr atom concentration decreased after recrystallization. As a result, an absorption coefficient at an excitation wavelength of 1.06 μm was changed from 1.6 cm$^{-1}$ before recrystallization to 0.2 cm$^{-1}$. These results show that the concentration of the light emission center $Cr^{4+}$ in the $Cr^{4+}$:YAG single crystal decreases to ⅛ by recrystallization.

The concentration of $Cr^{4+}$ in the single-crystal fiber waveguide 5 produced in this Example produces similar results, and the concentration ratio of the recrystallized region 6 to the non-melted region 7 becomes on the order of ⅛. The difference in lattice constant of the YAG single crystal depending on the concentration of an added Cr atom has been reported in Non-Patent Literature 6. The change ratio of the lattice constant depending on a $Cr_2O_3$ concentration is on the order of $5\times10^{-4}$ nm/wt %. The concentration of Cr added to the $Cr^{4+}$:YAG single-crystal fiber as the preform is on the order of $2\times10^{-2}$ wt % (Non-Patent Literature 4). According to calculation based on these factors, the lattice constant of the recrystallized region 6 is smaller by approximately $10^{-5}$ nm than that of the non-melted region 7. Since the situation of this Example is the same as that of Non-Patent Literature 3, calculation from the value of this literature shows that phase difference on the order of $\pi/20$ occurs in a waveguide having a length of 40 mm due to stress birefringence. This value is 1/10 of that of the conventional techniques and is thus sufficiently small. As a result, the single-crystal fiber waveguide 5 can guide, with low propagation loss, oscillatory light (or amplified light) that is linearly polarized light and has a gaussian beam profile.

FIG. 5($c$) is a schematic view of the single-crystal fiber waveguide 5 of cross-sectional light emission center distribution type produced in this Example when the single-crystal fiber waveguide 5 is used in a laser oscillator or amplifier. Excitation light 8 is incident on a first end face of the single-crystal fiber waveguide 5, and oscillatory light or amplified light 9 is radiated from the first or second end face. A $SiO_2$ vapor-deposited film (not shown) having a thickness of 1 μm is disposed on the outermost circumference of the single-crystal fiber waveguide 5. The $SiO_2$ vapor-deposited film functions as a clad for the single-crystal fiber waveguide 5 against the oscillatory light or amplified light 9. The incident excitation light 8 sharply focusing on the inside of the end face of the single-crystal fiber waveguide 5 is guided while totally reflected in the inside of the single-crystal fiber waveguide 5.

In this Example, the volume of the excited region, i.e., the volume of the non-melted region 7, is approximately 25% of the volume of the single-crystal fiber waveguide 5. Thus, the crystal fiber 5 produced in this Example, when used in a laser oscillator or amplifier, can improve excitation efficiency, as disclosed in Non-Patent Literature 1.

The irradiation with carbon dioxide gas laser is performed from four directions in Example 1 described above, but may be carried out from two directions, three directions, or five or more directions.

Figure 8:
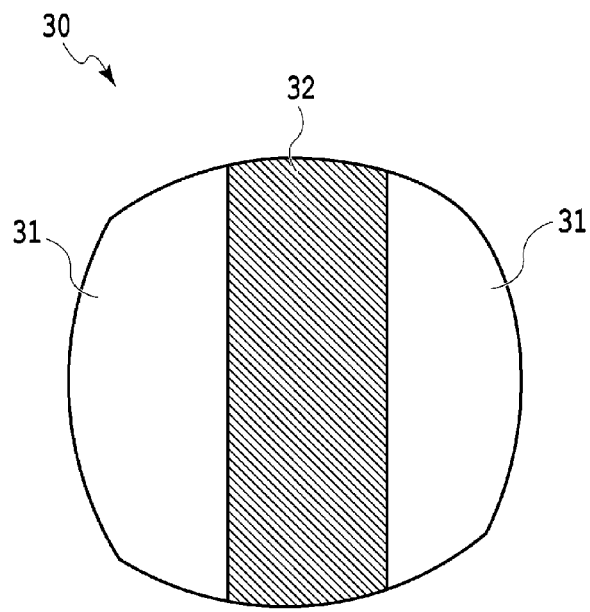
FIG. 8 is a cross-sectional view of a single-crystal fiber waveguide of cross-sectional light emission center distribution type produced by irradiation with carbon dioxide laser light from two directions in Example 1 of the present invention.

FIG. 8 shows a cross-sectional view of single-crystal fiber waveguide 30 produced when the direction of irradiation with carbon dioxide gas laser is two directions in steps S3 to S5. Recrystallized regions 31 are formed on the observers' right and left of FIG. 8, and non-melted region 32 is formed in the middle. These regions are uniformly formed in the longitudinal direction of the crystal fiber waveguide 30.

EXAMPLE 2

A method for producing single-crystal fiber waveguide 15 will be described as the second Example of the present invention. The single-crystal fiber waveguide 15 produced in this Example differs from the single-crystal fiber waveguide 5 produced in Example 1 in that the single-crystal fiber waveguide 15 has two recrystallized regions (16 and 26).

Figure 7:
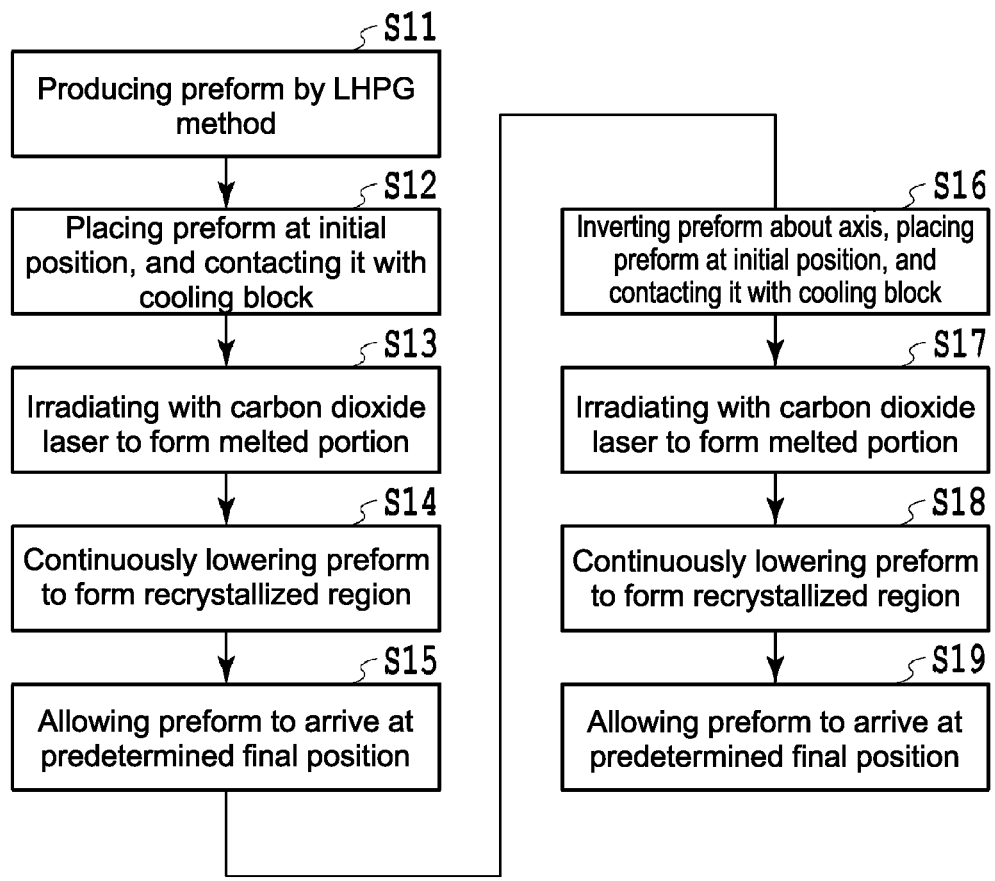
FIG. 7 is a flow diagram showing a method for producing a single-crystal fiber waveguide of cross-sectional light emission center distribution type in Example 2 of the present invention.

FIG. 7 is a flow diagram showing the production method in this Example. Each step (S11 to S19) will be described with reference to this flow diagram.

Preform 11 is $Cr^{4+}$:YAG single crystal, as in Example 1, and is produced by use of the LHPG method (S11). The diameter of the preform 11 in this Example is 120 µm.

Figure 6A:
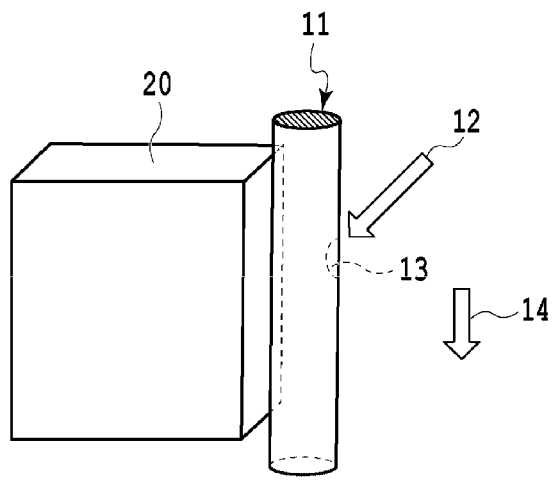
FIG. 6(a) is a schematic view showing a method for producing a single-crystal fiber waveguide of cross-sectional light emission center distribution type having a plurality of recrystallized regions.
Figure 6B:
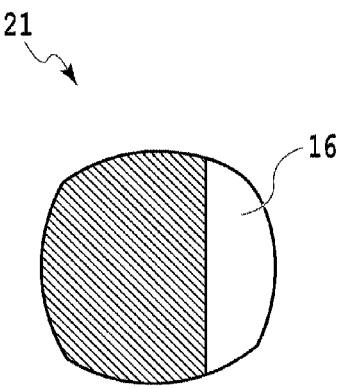
FIG. 6(b) is a cross-sectional view of a single-crystal fiber with a first recrystallized region produced in this Example.
Figure 6C:
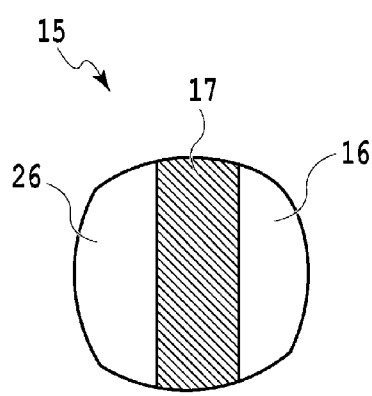
FIG. 6(c) is a cross-sectional view of a single-crystal fiber waveguide with a second recrystallized region further produced.

FIG. 6 is a schematic view showing the production method in this Example. FIG. 6(a) is a schematic view showing the method for producing the single-crystal fiber waveguide 15 having two recrystallized regions. FIG. 6(b) is a cross-sectional view of single-crystal fiber 21 with first recrystallized region 16 formed by this Example. FIG. 6(c) is a cross-sectional view of single-crystal fiber waveguide 15 with second recrystallized region 26 further formed in the single-crystal fiber 21.

The lower end in the longitudinal direction of the preform 11 is oriented in vertical direction 14. The preform 11 is placed such that a side near the lower end of the preform 11 where processing is started is located at the position of irradiation with carbon dioxide laser light 12 serving as a heat source. In this respect, a side opposed via the central axis to the side serving as the position of irradiation of the preform 11 is contacted with a cooling block (S12).

Cooling block 20 has a function of cooling the side of the preform 11 in contact therewith. A material for the cooling block 20 is selected from sapphire, diamond, and a metal.

A portion of the side of the preform 11 is melted with the carbon dioxide laser light 12 to form melted portion 13. In this respect, the output of the carbon dioxide laser light 12 is adjusted such that a given amount of the preform 11 in contact with the cooling block 20 remains as a crystal without being melted. In this context, a site near the central axis of the preform 11 is not melted (S13). An atmosphere in steps S13 to S15 is preferably a He (helium) atmosphere for effective cooling.

After the formation of the melted portion 13, the preform 11 is continuously lowered along the vertical direction 14 to recrystallize a lower portion of the melted portion 13. This continuously forms the recrystallized region 16. In this context, the cross-sectional shape of the recrystallized region 16 is uniform along the longitudinal direction (S14).

The lowering is terminated when the position of irradiation with carbon dioxide laser light reaches a predetermined position near the upper end in the longitudinal direction of the preform 11 (S15).

FIG. 6(b) is a cross-sectional view of the single-crystal fiber 21 at the completion of the steps up to step S15. In FIG. 6(b), a region on the observers' right is the first recrystallized region 16.

Next, the single-crystal fiber 21 is inverted about the axis, transferred upward, and brought back to the position where the preform 11 was placed first. Then, the cooling block 20 is contacted therewith, as in the step S12 (S16).

The single-crystal fiber 21 set in the step S16 was subjected to the same steps as the steps S13 to S15 (S17 to S19). As a result, the second recrystallized region 26 is formed along the longitudinal direction of the preform 11. Then, as in Example 1, thermal annealing treatment is performed in an oxygen atmosphere, and a $SiO_2$ vapor-deposited film is formed so as to cover the outer circumference, and used as a clad for the single-crystal fiber waveguide 15.

FIG. 6(c) is a cross-sectional view of the single-crystal fiber waveguide 15 produced in this Example. The recrystallized regions 16 and 26 are shown in the right and left ends. Non-melted region 17 remaining without being melted from the preform 11 has two sides adjacent to the recrystallized regions 16 and 26. The clad is not shown in FIG. 6(c). Both the maximum thicknesses of the recrystallized regions 16 and 26 from the non-melted region 17 are 40 µm. The cross section of the non-melted region 17 is of 40 µm in width and 120 µm in length and thus has a shape close to a rectangle.

The recrystallized regions 16 and 26 have a lower Cr concentration than that of the preform 11, as in Example 1, because Cr atoms volatilize from the melted portion 13 in the steps S14 and S18.

In this Example, the mode of growth at the time of recrystallization (S14 and S18 in FIG. 7) is accretionary growth and is the same as the mode of growth at the time of production of the preform 11 (S11 in FIG. 7). The degrees of change in lattice constant by the volatilization of Cr atoms from the melted portion in the steps S14 and S18, and stress birefringence in association therewith are equivalent to the degrees in Example 1. Thus, the single-crystal fiber waveguide 15 produced in this Example can guide, with lower propagation loss than ever, oscillatory light or amplified light that is linearly polarized light and has a gaussian beam profile, as in Example 1.

In this Example, the volume of the excited region, i.e., the volume of the non-melted region 17, is approximately 33% of the volume of the single-crystal fiber waveguide 15. Thus, the single-crystal fiber waveguide 15 produced in this Example, when used in a laser oscillator or amplifier, can improve excitation efficiency, as in Example 1, as described in Non-Patent Literature 1.

A material other than sapphire, diamond, and a metal is feasible as the material for use in the cooling block as long as the material has high thermal conductivity. Alternatively, a device having a structure for heat release, such as a heat pipe, is also feasible.

Although the cooling block is used in Example 2 described above, sufficient cooling by the atmosphere allows the melted portion having the desired shape to be formed by only the adjustment of the heat source.

The step of forming the recrystallized region is performed twice in Example 2 described above, but may be performed three or more times so that the single-crystal fiber waveguide has three or more recrystallized regions.

Although the carbon dioxide gas laser is used as a heat source in Examples 1 and 2 described above, glass fiber laser, semiconductor laser, or a lamp, or any of other heat sources is also feasible.

Examples 1 and 2 described above may be carried out using a material having a lower refractive index than that of a laser crystal, such as $Al_2O_3$ (aluminum oxide) or MgO (magnesium oxide), instead of $SiO_2$ as the clad material.

Examples 1 and 2 described above may be carried out using a YAG single crystal supplemented with Cr and Mg as impurities, as the preform, instead of the YAG single crystal supplemented with Cr and Ca as impurities.

Examples 1 and 2 may be carried out using $Lu_3Al_5O_{12}$ supplemented with the light emission center $Cr^{4+}$, Ti:sapphire, or Cr:forsterite as the preform.

Examples 1 and 2 described above may be carried out using a light emission center comprising a period 4 transition element such as Cr, Ti, Mn (manganese), Co (cobalt), Ni (nickel), V (vanadium), Fe (iron), or Cu (copper), or Zn (zinc), and using YAG, sapphire, forsterite, $Lu_3Al_5O_{12}$, $Lu_2O_3$, or $Y_2O_3$ as a host crystal. This is because, as described in Non-Patent Literature 7, oxides of these period 4 transition elements have a sufficiently large saturated vapor pressure around the melting point of the crystal (1900° C. to 2500° C.) and volatilize in the process of recrystallization.

The method for producing the preform is not limited to the LHPG method. Examples 1 and 2 may be carried out using, as the preform, a single-crystal fiber produced by the LHPG method described above as well as a micro-pull-down method or polishing as the method for producing the preform.

Examples 1 and 2 described above may be carried out using a crystal fiber with a plurality of single crystals joined, instead of the single-crystal fiber as the preform. For example, a material in which single-crystal fibers without the addition of a light emission center are joined to both ends of a single-crystal fiber of 1.5 mm in diameter supplemented with the light emission center may be used as the preform, as described in Non-Patent Literature 8.

REFERENCE SIGNS LIST 1 and 11 Preform
2 and 12 Carbon dioxide laser light
3 and 13 Melted portion
4 and 14 Vertical direction
5, 15, 30 and 101 Single-crystal fiber waveguide
6, 16, 26 and 31 Recrystallized region
7, 17 and 32 Non-melted region
8 and 108 Excitation light
9 and 109 Oscillatory light or amplified light
20 Cooling block
21 Single-crystal fiber at the completion of step S15
102 Middle portion
103 Neighboring portion

The invention claimed is:

1. A method for producing a crystal fiber of cross-sectional light emission center distribution type which concentrates a light emission center on or near the middle in a cross section of the crystal fiber, the method comprising the steps of:
using, as a preform, the crystal fiber comprising a light emission center that volatilizes from a melted portion upon the melting of a crystal, and heating a portion of the side of the preform or a plurality of portions of the side of the preform positionally equal in the longitudinal direction of the preform, whereby the portion or the plurality of portions of the preform are melted such that only a given amount of the inside of the portion or the plurality of portions of the preform is not melted, to form the melted portion; and
sequentially transferring the melted portion in the longitudinal direction of the preform, and cooling the melted portion, whereby the melted portion is continuously recrystallized to form a recrystallized region.

2. A method for producing a crystal fiber of cross-sectional light emission center distribution type which concentrates a light emission center on or near the middle in a cross section of the crystal fiber, the method comprising the steps of:
using, as a preform, the crystal fiber comprising a light emission center that volatilizes from a melted portion upon the melting of a crystal, and heating a portion of the side of the preform or a plurality of portions of the side of the preform positionally equal in the longitudinal direction of the preform, whereby the portion or the plurality of portions of the preform are melted such that only a given amount of the inside of the portion or the plurality of portions of the preform is not melted, to form the melted portion;
sequentially transferring the melted portion in the longitudinal direction of the preform, and cooling the melted portion, whereby the melted portion is continuously recrystallized to form a first recrystallized region;
a) heating a site that is the portion of the side of the preform or the plurality of portions of the side of the preform positionally equal in the longitudinal direction of the preform, and is a portion other than the first to n−1th (wherein n represents a positive integer with 2 as an initial value) recrystallized regions thus formed, whereby the portion or the plurality of portions of the preform are melted such that only a given amount of the inside of the portion or the plurality of portions of the preform is not melted, to form the melted portion;
b) sequentially transferring the melted portion in the longitudinal direction of the preform, and cooling the melted portion, whereby the melted portion is continuously recrystallized to form a nth recrystallized region; and
c) when the maximum value of the n is defined as M (wherein M represents a positive integer of 2 or larger), repeating the steps a) and b) predetermined times by increasing the n one by one until the n becomes predetermined M.

3. The method for producing a crystal fiber according to claim 2, wherein
the step of forming the first to Mth recrystallized regions is a step that is performed while cooling the portion or the plurality of portions of the preform opposed to the melted portion via an axis along the longitudinal direction of the preform.

4. The method for producing a crystal fiber according to claim 3, wherein
the step of forming the first to Mth recrystallized regions comprises contacting the portion or the plurality of portions of the preform with a cooling block when the portion or the plurality of portions of the preform are cooled.

5. The method for producing a crystal fiber according to claim 4, wherein
a material for the cooling block is a block using diamond, sapphire or a metal, or a heat pipe-incorporated block.

6. The method for producing a crystal fiber according to claim 1, wherein the cooling employs helium in an atmosphere.

7. The method for producing a crystal fiber according to claim 1, wherein the light emission center is any of period 4 transition metal elements titanium (Ti), vanadium (V), chromium (Cr), manganese (Mn), iron (Fe), cobalt (Co), nickel (Ni), or copper (Cu), or zinc (Zn).

8. The method for producing a crystal fiber according to claim 1, wherein the preform is crystalline and is any of yttrium-aluminum-garnet supplemented with tetravalent chromium ($Cr^{4+}$:YAG), Ti:sapphire or Cr:forsterite.

9. The method for producing a crystal fiber according to claim 1, wherein the preform is a fiber consisting of a single crystal or a fiber with a plurality of single crystals joined.

10. The method for producing a crystal fiber according to claim 1, further comprising, after the completion of the step of forming the recrystallized region, the step of forming a thin film for use as a clad on the entire circumference of the side of the crystal fiber.

11. The method for producing a crystal fiber according to claim 1, further comprising, after the completion of the step of forming the recrystallized region,
   an annealing step of elevating the temperature of the crystal fiber to a predetermined temperature equal to or lower than the melting point of the preform, maintaining the predetermined temperature for a predetermined time, and then slowly cooling the crystal fiber over a predetermined time.

12. The method for producing a crystal fiber according to claim 11, further comprising, after the annealing step, the step of forming a thin film for use as a clad on the entire circumference of the side of the crystal fiber.

13. The method for producing a crystal fiber according to claim 10, wherein a material for the clad is silicon dioxide ($SiO_2$), aluminum oxide ($Ai_2O_3$), or magnesium oxide (MgO).

14. The method for producing a crystal fiber according to claim 1, wherein a heat source for heating the preform is any of a laser, a lamp or other radiation sources.

* * * * *